(12) United States Patent
Im et al.

(10) Patent No.: US 10,811,470 B2
(45) Date of Patent: Oct. 20, 2020

(54) DISPLAY DEVICE

(71) Applicant: Samsung Display Co. Ltd, Yongin-si, Gyeonggi-do (KR)

(72) Inventors: Jae Woo Im, Seoul (KR); Jung Hun Noh, Yongin-si (KR); Yi Joon Ahn, Seoul (KR); Sung Chan Jo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/156,075

(22) Filed: Oct. 10, 2018

(65) Prior Publication Data

US 2019/0341433 A1  Nov. 7, 2019

(30) Foreign Application Priority Data

May 2, 2018  (KR) .................. 10-2018-0050526

(51) Int. Cl.
*H01L 51/00* (2006.01)
*H01L 27/32* (2006.01)
*H01L 51/52* (2006.01)
*H04R 1/02* (2006.01)

(52) U.S. Cl.
CPC ...... *H01L 27/3225* (2013.01); *H01L 27/3276* (2013.01); *H01L 51/0097* (2013.01); *H01L 51/524* (2013.01); *H01L 51/529* (2013.01); *H01L 2251/5338* (2013.01); *H04R 1/028* (2013.01); *H04R 2499/15* (2013.01)

(58) Field of Classification Search
CPC ........... H01L 27/323; H01L 2251/5338; H01L 51/0097; H01L 23/5387
See application file for complete search history.

(56) References Cited

U.S. PATENT DOCUMENTS

| 9,287,329 | B1 * | 3/2016 | Lee ..................... H01L 51/0097 |
| 9,497,545 | B1 | 11/2016 | Keen et al. |
| 9,799,708 | B2 | 10/2017 | Hong et al. |
| 2014/0355777 | A1 * | 12/2014 | Nabata ................... H04R 3/002 381/71.14 |
| 2014/0355792 | A1 * | 12/2014 | Nabata ................... H04R 17/10 381/162 |
| 2014/0366273 | A1 | 12/2014 | Davis, II et al. |
| 2015/0023531 | A1 * | 1/2015 | Horii ...................... H04R 17/00 381/190 |

(Continued)

*Primary Examiner* — Jaehwan Oh
(74) *Attorney, Agent, or Firm* — Cantor Colburn LLP

(57) ABSTRACT

A display device includes a display panel including a display area including: a stretchable display area at which the display panel is stretchable, disposed at an outer edge of the display device, and a normal display area having flexibility less than that of the stretchable display area, the normal display area disposed further from the outer edge of the display device than the stretchable display area; a cover window disposed on the display panel, including a peripheral portion and a central portion which is disposed further from the outer edge of the display device than the peripheral portion; and a vibration member disposing the normal display area having the flexibility less than that of the stretchable display area between the central portion of the cover window and the vibration member along a thickness direction of the display device.

14 Claims, 7 Drawing Sheets

(56) References Cited

U.S. PATENT DOCUMENTS

| | | | |
|---|---|---|---|
| 2015/0030188 A1* | 1/2015 | Nabata | H04R 17/00 |
| | | | 381/190 |
| 2015/0036843 A1* | 2/2015 | Nabata | H04R 7/045 |
| | | | 381/151 |
| 2015/0110318 A1* | 4/2015 | Miyano | H04R 17/00 |
| | | | 381/318 |
| 2015/0117678 A1* | 4/2015 | Miyano | B06B 1/0611 |
| | | | 381/151 |
| 2016/0035812 A1* | 2/2016 | Kwon | H01L 27/323 |
| | | | 257/40 |
| 2016/0172428 A1* | 6/2016 | Song | H01L 27/3276 |
| | | | 257/99 |
| 2016/0172623 A1* | 6/2016 | Lee | H01L 27/3276 |
| | | | 257/40 |
| 2016/0174304 A1* | 6/2016 | Kim | H01L 51/0097 |
| | | | 313/511 |
| 2016/0181346 A1* | 6/2016 | Kwon | H01L 27/3276 |
| | | | 257/40 |
| 2016/0202869 A1* | 7/2016 | Kim | G06F 1/1626 |
| | | | 715/841 |
| 2016/0268352 A1* | 9/2016 | Hong | H01L 27/326 |
| 2016/0280548 A1 | 9/2016 | Bao et al. | |
| 2017/0011726 A1 | 1/2017 | Bezginas | |
| 2017/0280234 A1* | 9/2017 | Choi | G06F 1/1605 |
| 2017/0371190 A1* | 12/2017 | Yamazaki | G02F 1/133305 |
| 2018/0033979 A1* | 2/2018 | Jang | B32B 27/18 |
| 2018/0062090 A1* | 3/2018 | Kim | H01L 51/5253 |
| 2018/0097199 A1* | 4/2018 | Jo | H01L 51/0097 |
| 2018/0123060 A1* | 5/2018 | Jang | H01L 27/1218 |
| 2018/0182838 A1* | 6/2018 | Yeo | H01L 27/3279 |

* cited by examiner

DISPLAY DEVICE

This application claims priority to Korean Patent Application No. 10-2018-0050526, filed on May 2, 2018, and all the benefits accruing therefrom under 35 U.S.C. § 119, the contents of which in their entirety are herein incorporated by reference.

BACKGROUND

1. Field

The invention relates to a display device.

2. Description of the Related Art

The importance of a display device has increased with the development of multimedia. Accordingly, various types of display devices such as a liquid crystal display ("LCD") and an organic light emitting display ("OLED") have been used.

Among display devices, a liquid crystal display device, which is one of the most widely used flat panel display devices, includes two substrates including electric field generating electrodes such as a pixel electrode and a common electrode, and a liquid crystal layer disposed therebetween. In the liquid crystal display device, a voltage is applied to the electric field generating electrodes to form an electric field in the liquid crystal layer, so that the alignment of liquid crystal molecules in the liquid crystal layer is determined, and the polarization of incident light is controlled, thereby displaying an image.

Further, among display devices, an organic light emitting display device displays an image using an organic light emitting element generating light by recombination of electrons and holes. The organic light emitting display device is advantageous in that it has a relatively high response speed, high luminance and wide viewing angle, and is driven by relatively low power consumption.

Interests in display devices for which a shape thereof is deformable have increased with the development of display-related technologies. Thus, research and development on flexible display devices that can be deformed such as by being rolled or folded and stretchable displays that can be deformed such as by being extended are actively under way.

SUMMARY

One or more embodiment of the invention provides a display device having improved sound transfer capability through vibration.

One of more of another embodiment of the invention provides a display device having a relatively narrow bezel.

According to one or more embodiment of the invention, there is provided a display device, including: a display panel including a display area at which an image is displayed, the display area including: a stretchable display area at which the display panel is stretchable, disposed at an outer edge of the display device, and a normal display area having flexibility less than that of the stretchable display area, the normal display area disposed further from the outer edge of the display device than the stretchable display area; a cover window disposed on the display panel, including a peripheral portion and a central portion which is disposed further from the outer edge of the display device than the peripheral portion; and a vibration member which transfers sound through vibration, the vibration member disposing the normal display area having the flexibility less than that of the stretchable display area between the central portion of the cover window and the vibration member along a thickness direction of the display device.

The peripheral portion may overlap the stretchable display area.

The stretchable display area may include an island provided in plurality spaced apart from each other, and a bridge provided in plurality respectively connecting the plurality of islands to each other, the bridge being stretchable.

The stretchable display area of the display panel may further include a display unit with which the image is generated, the display unit including an organic light emitting diode, where the display unit including the organic light emitting diode is disposed on the island of the stretchable display area.

The stretchable display area of the display panel may further include a first wiring and a second wiring disposed in different layers of the display panel and each electrically connected to the display unit.

The bridge which is stretchable may have a serpentine shape extended between islands connected to each other by the bridge, and each of the first wiring and the second wiring: may be connected to both display units respectively disposed on the islands connected to each other by the bridge which is stretchable, and may have a serpentine shape corresponding to that of the bridge to be stretchable together with the bridge.

The display device may further include: a bracket in which the vibration member and the display panel are accommodated, where the bracket is attached to the peripheral portion of the cover window and disposes the display panel and the vibration member between the bracket and the cover window.

The display device may further include: a cover panel which radiates heat from or absorbs an impact to the display panel, disposed between the display panel and the bracket.

The display device may further include: an adhesive layer disposed between the bracket and the cover panel.

The vibration member may include a piezo material.

The peripheral portion may extend further than the normal display area of the display panel, the extended peripheral portion being bent with at least one curvature in the thickness direction of the display device.

The stretchable display area may extend further than the central portion of the cover window to be bent corresponding to the curvature of the peripheral portion of the cover window.

The central portion may have flexibility less than that of the peripheral portion of the cover window.

Within the cover window, a material of the central portion having flexibility less than that of the peripheral portion may include glass, and a material of the peripheral portion having flexibility greater than that of the central portion may include at least one selected from plastic, silicone and a polymer material having elasticity.

According to one or more of another embodiment of the invention, there is provided a display device, including: a cover window through which an image is displayed, including a central portion and a peripheral portion which is disposed closer to an outer edge of the display device than the central portion; a first display panel with which an image is displayed, including: a first dummy area corresponding to the central portion of the cover window, and a stretchable display area at which the image of the first display panel is displayed and at which the first display panel is flexible, the stretchable display area disposed closer to the outer edge of the display device than the first dummy area; and a second display panel with which an image is displayed, including: a normal display area corresponding to the first dummy area of the first display panel and at which the image of the second display panel is displayed, and a second dummy area disposed corresponding to the stretchable display area of the first display panel, the second dummy area disposed closer to the outer edge of the display device than the normal display area, where the flexibility of the stretchable display area of the first display panel is greater than that of the normal display area of the second display panel, and flexibility of the peripheral portion of the cover window is greater than that of the central portion of the cover window.

The second dummy area may have optical transparency and may include an elastic material.

The second dummy area, the stretchable display area, and the peripheral portion may overlap one another.

The first dummy area may have substantially a same planar area as the normal display area.

The stretchable display area of the first display panel may include: an island provided in plurality spaced apart from each other, and a bridge provided in plurality respectively connecting the plurality of islands to each other, the bridge being stretchable.

The stretchable display area of the first display panel may further include a display unit with which the image of the first display panel is generated, the display unit including an organic light emitting diode, where the display unit including the organic light emitting diode is disposed on the island of the stretchable display area.

Therefore, within one or more embodiment of the display device, call quality and quality of sound transferred through vibration may be improved.

However, features of the invention are not restricted to the one set forth herein. The above and other features of the invention will become more apparent to one of ordinary skill in the art to which the invention pertains by referencing the detailed description of the invention given below.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1:
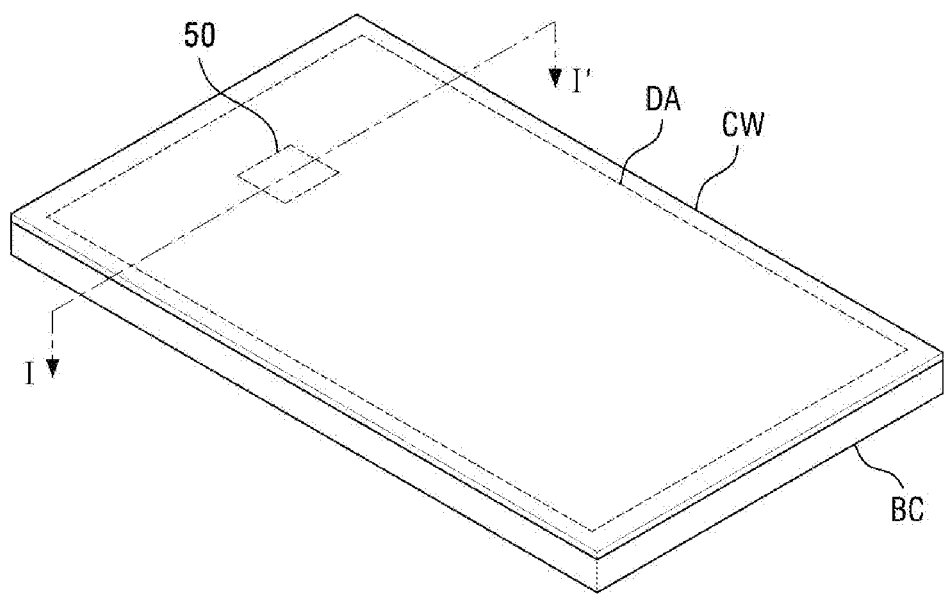
FIG. 1 is a perspective view of an embodiment of a display device according to the invention.

The advantages and features of the invention and methods for achieving the advantages and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. In the entire description of the invention, the same drawing reference numerals are used for the same elements across various figures.

Although the terms "first," "second" and so forth are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper,"

depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
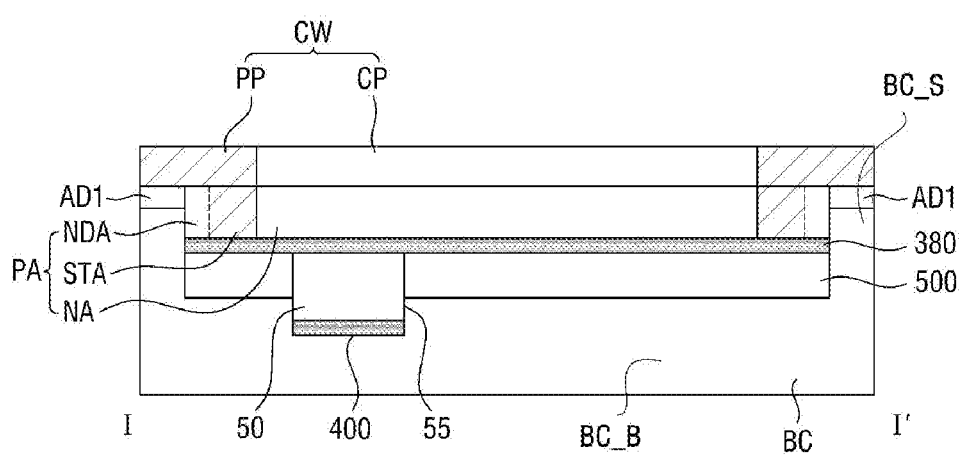
FIG. 2 is a cross-sectional view taken along line I-I' in FIG. 1.

FIG. 1 is a perspective view of an embodiment of a display device according to the invention. FIG. 2 is a cross-sectional view taken along line I-I' in FIG. 1.

Referring to FIGS. 1 and 2, a display device according to an embodiment of the invention includes a display panel PA, a cover window CW disposed on the display panel PA, and a vibration member 50 disposed under the display panel PA.

The display device according to an embodiment of the invention may further include a bracket BC and a cover panel 500. The display device and components thereof may be disposed in a plane defined by first and second directions which cross each other. A thickness of the display device and/or components thereof is disposed along a third direction which crosses each of the first and second directions. In FIG. 2, a vertical direction may represent the third (thickness) direction, while a horizontal direction may represent the first and/or second directions.

A bezel of the display device is viewable along the thickness direction, e.g., vertically top-down in FIG. 2, in a top plan view. A size of the bezel is taken along the first and/or second directions, e.g., the horizontal direction in FIG. 2.

Referring to FIG. 1, the bracket BC may be coupled with the cover window CW to form an outer appearance of the display device. That is, the bracket BC and the cover window CW may form outermost surfaces of the display device.

The bracket BC may accommodate therein various components of the display device to be described later. For this purpose, the bracket BC may include a bottom portion BC_B and a side wall BC_S. The side wall BC_S may extend from an outer edge of the bottom portion BC_B at one or more sides of the display device.

In an embodiment, the side wall BC_S of the bracket BC may be engaged with the cover window CW to be coupled thereto and form the outer appearance of the display device. For this purpose, a first adhesive layer AD1 may be interposed between a distal end of the side wall BC_S of the bracket BC and the cover window CW.

In an embodiment, the first adhesive layer AD1 may be a heat-activated tape. In this case, when the first adhesive layer AD1 is heated to a specific temperature, the adhesive performance of the first adhesive layer AD1 increases, and thus the side wall BC_S of the bracket BC may be attached to the cover window CW.

The first adhesive layer AD1 may be considered a portion of the bracket BC or the cover window CW. The first adhesive layer AD1 may form a portion of the outer appearance of the display device, along with the bracket BC and the cover window CW. In this way, when the side wall BC_S of the bracket BC is directly attached to the cover window CW, a separate member does not overlap or block the upper surface of the cover window CW in the top plan view. Thus, a display device having no bezel or having a minimal (e.g., very narrow) bezel can be realized.

In an embodiment, the first adhesive layer AD1 may be in contact with the display panel PA. Specifically, the first adhesive layer AD1 may be in contact with a component of the display panel PA in a non-display area NDA of the display panel PA. Details of the non-display area NDA will be described later.

In an embodiment, the bottom portion BC_B of the bracket BC may be provided with a mounting portion 55. The mounting portion 55 may have a groove shape recessed from the upper surface of the bottom portion BC_B by a predetermined distance along the thickness direction (e.g., vertical direction in FIG. 2). A vibration member 50 may be mounted in the mounting portion 55.

In an embodiment, a fixing layer 400 may be disposed on the bottom of the mounting portion 55. The fixing layer 400 has adhesive performance to fix the vibration member 50 to the mounting portion 55. However, in another embodiment, the fixing layer 400 may be omitted and the vibration member 50 may be fixed to the mounting portion by a fixing element different from the fixing layer 400 or solely by a coupling of the vibration member 50 and the mounting portion 55 to each other.

The vibration member 50 can transfer sound therefrom through vibration. That is, for this purpose, the vibration member 50 may include a vibration element that generates vibration and provides the vibration such as to outside the vibration member 50. In an embodiment, the vibration element may include a piezo material, for example, polyvinylidene fluoride ("PVDF") or lead zirconium titanate ceramic ("PZT"), which vibrates under a constant electric field.

Since the vibration member 50 transfers sound through vibration, the vibration generated in the vibration member 50 and transferred to a user is maximized by minimizing a loss of the vibration. As will be described later, each of the display panel PA and the cover window CW may have an advantageous structure to which vibration is transferred from the vibration member 50.

In an embodiment, the vibration member 50 may be disposed of formed extended through the cover panel 500. Specifically, at least one through-hole (not shown) may be defined or formed in the cover panel 500, and the vibration member 50 may be inserted into the through-hole. The through-hole may penetrate an entirety of the thickness of the cover panel 500, without being limited thereto.

The cover panel 500 may be disposed or formed on the bracket BC, and may cover the back surface of the display panel PA. In the top plan view, an entirety of the back surface of the display panel PA may be overlapped by the cover panel 500 to be covered thereby.

In an embodiment, the cover panel 500 can perform a heat radiation function and/or a shock absorption function.

Although it is shown in FIG. 2 that the cover panel 500 is a single layer, the invention is not limited thereto. That is, in another embodiment, the cover panel 500 may include a plurality of functional layers which are stacked and/or coupled to each other.

In an embodiment, the cover panel 500 may include or be formed of a metal material such as gold, silver or copper, a material including graphite, or a material including carbon nanotubes, in order to perform the heat radiation function.

In an embodiment, the cover panel 500 can serve to reduce or effectively prevent damage to the display device from an external impact applied thereto, by absorbing the external impact. For this purpose, the cover panel 500 may include or be made of an elastic material such as a polyurethane resin or a polyethylene resin.

A light-blocking adhesive layer 380 may be disposed on the cover panel 500, such as at a side of the cover panel 500 closest to a viewing side of the display device. The light-blocking adhesive layer 380 has an adhesive performance, and may be disposed between the display panel PA and the cover panel 500. The light-blocking adhesive layer 380 disposed between the display panel PA and the cover panel 500 may attach the display panel PA to the cover panel 500. The light-blocking adhesive layer 380 can serve to absorb external light incident thereto, such as external light transmitted through the cover window CW to the light-blocking adhesive layer 380. For this purpose, the light-blocking adhesive layer 380 may include a colored pigment, particularly, a black pigment.

The display panel PA may be disposed on the light-blocking adhesive layer 380, at a side of the light-blocking adhesive layer 380 closes to the viewing side of the display device. Details of the display panel PA will be described with reference to FIG. 3.

Figure 3:
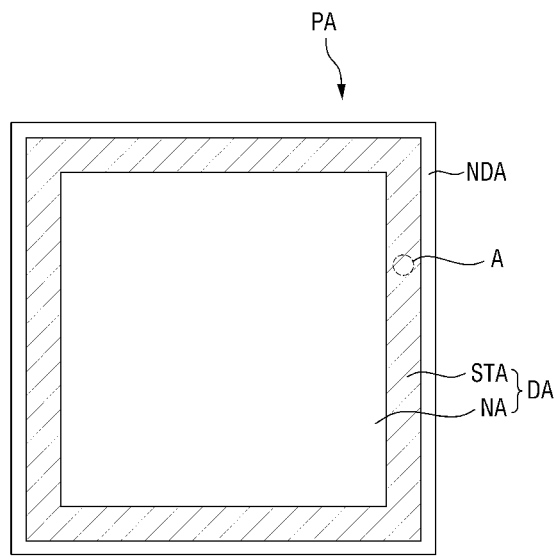
FIG. 3 is a partial top plan view of an embodiment of a display panel of a display device according to the invention.

FIG. 3 is a partial top plan view of an embodiment of a display device according to an embodiment of the present invention. FIG. 3 is a top plan view of the display panel PA indicated in FIGS. 1 and 2 according to the invention. The cover window CW and the bracket BC of the display device in FIGS. 1 and 2 are omitted for convenience of explanation.

Referring to FIG. 3, the display panel PA may include a display area DA and a non-display area NDA which is disposed outside the display area DA in the top plan view. In an embodiment, the display panel PA may include a base substrate common to each of the display area DA and the non-display area NDA. The base substrate of the display panel PA may include an insulating (base) substrate on which various layers of the display panel PA are disposed to define a pixel, a display unit, a light-emitting area, a stretchable area, a non-stretchable (e.g., normal) area, etc.

The non-display area NDA is disposed outside the display area DA, and is defined as an area where an image is not displayed. In an embodiment, the non-display area NDA may be disposed to surround the display area DA. Although it is shown in FIG. 3 that the non-display area NDA surrounds the display area DA, the invention is not limited thereto. In another embodiment, the non-display area NDA may be disposed adjacent to only one side of the display area DA, or may be disposed adjacent to more than one side of the display area DA.

In an embodiment, a plurality of pads or terminal (not shown) may be disposed in the non-display area NDA, such as on the base substrate of the display panel PA. The plurality of pads of the display panel PA may be connected to components or layers within the display panel PA, such as those at the display area DA of the display panel PA. The plurality of pads of the display panel PA may also be connected to an element external to the display panel PA, such as a printed circuit board (not shown). Data signals, control/driving signals and/or power signals for driving the display device to display an image may be provided to and from the external component, through the plurality of pads, from and to the display panel PA, respectively.

The display area DA may be disposed inside the non-display area NDA. The display area DA is an area at which an image is displayed, and may include at least one pixel. A pixel is a basic structure or element for generating and displaying the image. A plurality of pixels may be disposed within the display area DA. The plurality of pads at the non-display area NDA may be connected to pixels at the display area DA thereof. In an embodiment, the signals described above may be provided from the component external to the display panel PA and to the pixels via the plurality of pads, to display the image.

In an embodiment, the display area DA may include a normal (e.g., less flexible or stretchable) display area NA and a stretchable (e.g., more flexible or stretchable) display area STA. Each of the less flexible normal display area NA and the more flexible stretchable display area STA may be disposed in a same plane as each other, as illustrated in FIG. 2.

The normal display area NA and the stretchable display area STA are the same as each other in the respect that each includes at least one pixel for generating and displaying an image. That is, an image may be display at each of the normal display area NA and the stretchable display area STA. In an embodiment, each of the normal display area NA and the stretchable display area STA may include on the base substrate of the display panel PA, a same collection of layers constituting the pixel such as a display unit, a switching element, a light-emitting area, etc. However, the physical structure of portions a base substrate disposed in the display area DA of the display panel PA may be somewhat different from each other.

Specifically, the stretchable display area STA may have greater flexibility than the normal display area NA. In this specification the "having greater flexibility" may mean that the extent of stretching is greater when the same force is applied. In other words, if the stretchable display area STA and the normal display area NA are deformed by the same force, such as being pulled in a direction, the stretchable display area STA may be extended further relative to the normal display area NA.

In addition, the stretchable display area STA may have elasticity. That is, even if the stretchable display area STA is extended by a predetermined distance by applying an external force to the stretchable display area STA, the stretchable display area STA may be restored to an original shape when the applied external force is removed.

In an embodiment, the difference in flexibility between the stretchable display area STA and the normal display area NA may be attributed to the structural characteristics of a (base) substrate disposed in the stretchable display area STA (hereinafter referred to as a stretchable substrate STS) as compared to the structural characteristics of a base substrate not disposed in the stretchable display area STA.

Figure 4:
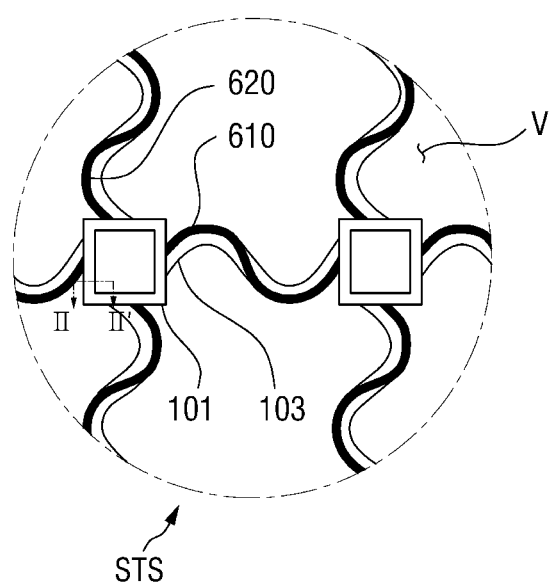
FIG. 4 is an enlarged top plan view of portion "A" in FIG. 3.

FIG. 4 is an enlarged view of portion "A" in FIG. 3.

Referring to FIG. 4, the stretchable display area STA may include a stretchable substrate STS.

The stretchable substrate STS may be an insulating (base) substrate having a structure as described below.

The stretchable substrate STS may include a plurality of islands 101 spaced apart from each other and a plurality of bridges 103 which connect the plurality of islands 101 to each other. In an embodiment, the plurality of the islands 101 and the plurality of bridges 103 may be integrally formed. In an embodiment, the structure for forming the stretchable substrate STS may include or be formed of an organic material having elasticity and ductility. An example of the organic material may include polyimide ("PI"). However, this is illustrative, and the material of the stretchable substrate STS is not limited thereto, any of a number of materials having elasticity or ductility may be used as the material of the stretchable substrate STS.

In an embodiment, a display unit 600 may be disposed on the island 101.

Each of the plurality of bridges 103 may have a non-linear shape such as a serpentine shape or a zigzag shape in a plan view, without being limited thereto. Thus, when an external force is applied to the stretchable substrate STS, the serpentine bridge 103 may be partially stretched and extended.

In an embodiment, an external force may be applied along directions forming the plane in which the stretchable substrate STS is disposed. Referring to FIG. 4, an external force may be applied along the page view, e.g., in a direction vertical, horizontal and/or inclined. Since the island 101 and bridges 103 are arranged along the page view (e.g., in the plane in which the stretchable substrate STS is disposed), the applied external force may change a position of the island and/or the bridges 103 within the plane from an original position. Additionally and/or alternatively, an external force may be applied along the thickness direction of the stretchable substrate STS, e.g., into the page view of FIG. 4. Accordingly, a distance between the adjacent islands 101, taken along the plane directions and/or the thickness direction, may increase and decrease. Thus, the stretchable substrate STS may have a two-dimensional and/or three-dimensional shape change.

Since empty spaces V are defined or formed among the plurality of bridges 103 and the islands 101, the stretchable substrate STS may have a net pattern as a whole. The empty spaces V may be portions of the stretchable substrate STS at which the plurality of bridges 103 and the islands 101 are not disposed. Due to such a structure, the stretchable substrate STS may have relatively high flexibility. In an embodiment, the base substrate of the display panel PA may be exposed at the empty spaces V formed among the plurality of bridges 103 and the islands 101.

A first wiring 610 and a second wiring 620 may be disposed on the stretchable substrate STS. The first wiring 610 and the second wiring 620 may be connected to the display unit 600, and may transmit a signal to and/or from the display unit 600 for driving the display unit 600. In an embodiment, the first wiring 610 and the second wiring 620 may be disposed on the base substrate of the display panel PA at the stretchable substrate STS portion thereof.

In an embodiment, each of the first wiring 610 and the second wiring 620 may include at least one selected from aluminum (Al)-based metals including aluminum alloys, silver (Ag)-based metals including silver alloys, copper (Cu)-based metals including copper alloys, molybdenum (Mo)-based metals including molybdenum alloys, chromium (Cr), titanium (Ti) and tantalum (Ta).

In an embodiment, each of the first wiring 610 and the second wiring 620 may have a shape corresponding to the shape of the bridge 103. Specifically, each of the first wiring 610 and the second wiring 620 may at least partially overlap the bridge 103 in the top plan view, and may have a serpentine shape or a zigzag shape. When each of the first wiring 610 and the second wiring 620 has a serpentine shape or a zigzag shape, each of the first wiring 610 and the second wiring 620 may be stretched or contracted by a predetermined distance. That is, due to such as structure, each of the first wiring 610 and the second wiring 620 may have flexibility or elasticity.

Accordingly, when the bridge 103 is stretched, each of the first wiring 610 and the second wiring 620 may also be stretched at least partially, and stress to the wirings caused by the stretching is minimized due to the flexibility or elasticity of the bridge 103. In other words, each of the first wiring 610 and the second wiring 620 having the above-described structure can withstand the stress generated when the stretchable substrate STS is stretched, without breakage.

In an embodiment, the first wiring 610 may include or be made of the same material as a gate electrode GE to be described later. In an embodiment of a method of manufacturing a display device, the first wiring 610 may be formed simultaneously with the gate electrode GE and/or in the same process. In this case, the first wiring 610 is formed from or made of the same material as the gate electrode GE, and may be disposed in the same layer as the gate electrode GE. That is, the first wiring 610 and the gate electrode GE may be formed from a same material layer in manufacturing the display device.

In an embodiment, the second wiring 620 may include or be made of the same material as a source electrode SE and/or a drain electrode DE to be described later. In an embodiment of a method of manufacturing a display device, the second wiring 620 may be formed simultaneously with the source electrode SE and/or the drain electrode DE and/or in the same process. In this case, the second wiring 620 is formed from or made of the same material as the source electrode SE and/or the drain electrode DE, and may be disposed in the same layer as the source electrode SE and/or the drain electrode DE. That is, the second wiring 620 and the source electrode SE and/or the drain electrode DE may be formed from a same material layer in manufacturing the display device.

In an embodiment, at least one organic light emitting diode OLED (refer to FIG. 5) may be disposed in or on the display unit 600. The display unit 600 may be driven to generate and/or emit light for displaying an image.

Figure 5:
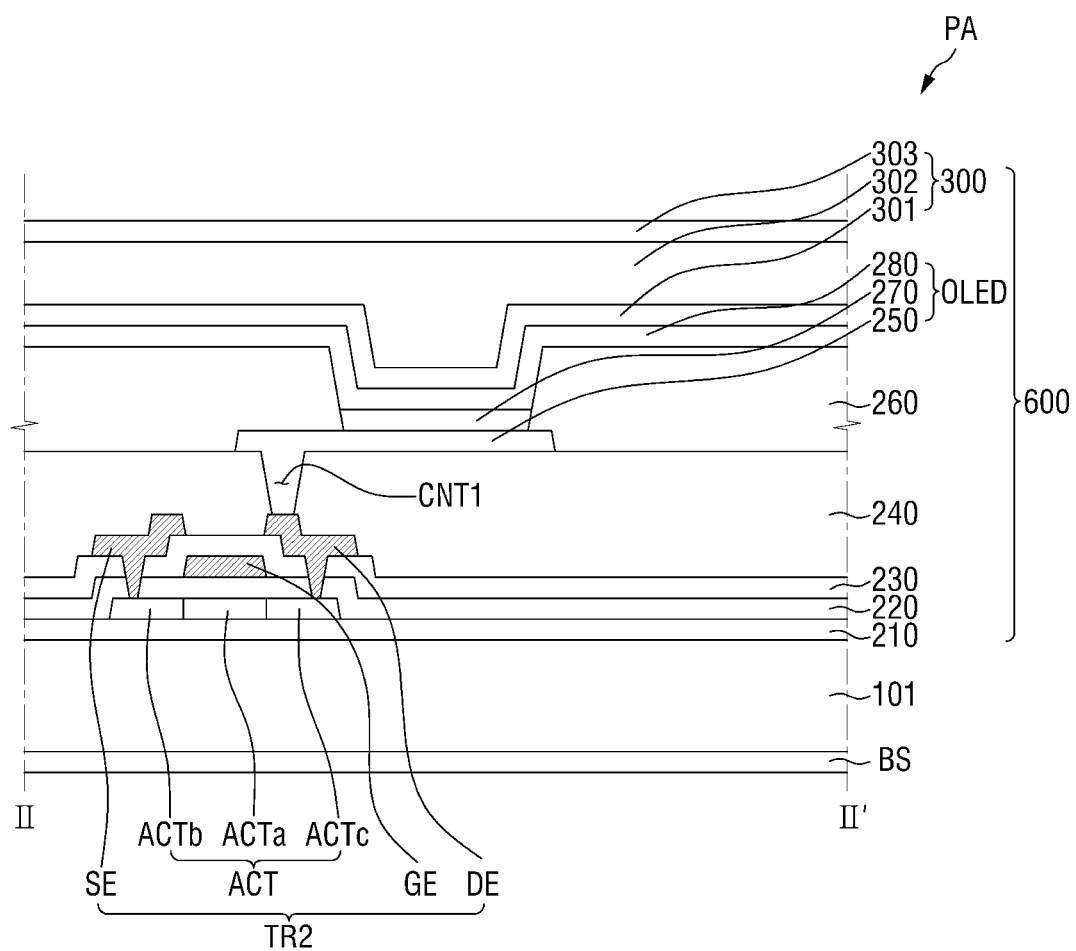
FIG. 5 is a cross-sectional view taken along line II-II in FIG. 4.

Details thereof will be described with reference to FIG. 5. FIG. 5 is a cross-sectional view taken along line II-II' in FIG. 4.

Referring to FIG. 5, a buffer layer 210 may be disposed on the island 101. The buffer layer 210 may planarize the surface of the island 101. In an embodiment, the buffer layer 210 may include any one of a silicon nitride (SiNx) film, a silicon oxide ($SiO_2$) film and a silicon oxynitride (SiOxNy)

film. The buffer layer 210 may be omitted according to the type of the stretchable substrate STS and/or the process conditions thereof A semiconductor layer including a semiconductor pattern ACT may be disposed on the buffer layer 210. The semiconductor layer will be described with reference to the semiconductor pattern ACT. In an embodiment, the semiconductor pattern ACT may include or be formed of any of a number of materials selected from polycrystalline silicon, monocrystalline silicon, low-temperature polycrystalline silicon, amorphous silicon, and oxide semiconductor, or may be formed by combining two or more materials selected therefrom.

In an embodiment, the semiconductor pattern ACT may include a channel region ACTa not doped with impurities, a source region ACTb doped with impurities, and a drain region ACTc. The source region ACTb is disposed at a first side of the channel region ACTa, and is electrically connected to the source electrode SE to be described later. The drain region ACTc is disposed at a second of the channel region ACTa which opposes the first side thereof, and is electrically connected to the drain electrode DE to be described later.

A first insulating layer 220 may be disposed on the semiconductor layer including the semiconductor pattern ACT. In an embodiment, the first insulating layer 220 may be a gate insulating layer. In an embodiment, the first insulating layer 220 may include or be formed of any of a number of materials selected from inorganic materials such as silicon oxides (SiOx) and silicon nitrides (SiNx) and organic materials such as benzocyclobutene ("BCB"), acrylic materials and polyimide, or may be formed by combining two or more materials selected therefrom.

A gate conductor including a gate electrode GE may be disposed on the first insulating layer 220. The gate electrode GE may overlap the semiconductor pattern ACT. The gate conductor may include at least one material selected from aluminum (Al)-based metals including aluminum alloys, silver (Ag)-based metals including silver alloys, copper (Cu)-based metals including copper alloys, molybdenum (Mo)-based metals including molybdenum alloys, chromium (Cr), titanium (Ti) and tantalum (Ta).

In an embodiment, the first wiring 610 may be electrically connected to the gate electrode GE. Accordingly, the first wiring 610 may receive a gate signal and transmit the gate signal to the gate electrode GE.

A second insulating layer 230 may be disposed on the gate conductor including the gate electrode GE. The second insulating layer 230 may include or be formed of any one of a number of materials selected from inorganic materials such as silicon oxides (SiOx) and silicon nitrides (SiNx) and organic materials such as benzocyclobutene ("BCB"), acrylic materials and polyimide, or may be formed by combining two or more materials selected therefrom.

A data conductor including a source electrode SE and a drain electrode DE may be disposed on the second insulating layer 230. The source electrode SE and the drain electrode DE are disposed on the second insulating layer 230 to be spaced apart from each other. The data conductor may include at least one material selected from metals, alloys, metal nitrides, conductive metal oxides and transparent conductive materials. In an embodiment, the data conductor may have a single-layer or multi-layer structure including nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), or the like. Further, an alloy formed by combining at least one material selected from titanium (Ti), zirconium (Zr), tungsten (W), tantalum (Ta), niobium (Nb), platinum (Pt), hafnium (Hf), oxygen (O), and nitrogen (N) with the above metal may be used as the material of the source electrode SE and the drain electrode DE.

The source electrode SE may be electrically connected to the second wiring 620. The second wiring 620 may receive a data signal and transmit the data signal to the source electrode SE.

The semiconductor pattern ACT, the gate electrode GE, the source electrode SE and the drain electrode DE constitute a switching element TR2. Although it is shown in FIG. 5 that the switching element TR2 is a top gate type switching element, the invention is not limited thereto. That is, the switching element TR2 may be a bottom gate type switching element.

A planarization layer 240 may be disposed on the data conductor. The planarization layer 240 can increase the luminous efficiency of a pixel electrode 250 and an organic light emitting layer 270, which will be described later, by removing a step difference between layers. In an embodiment, the planarization layer 240 may include an organic material. In an embodiment, for example, the planarization layer 240 may include be made of at least one material selected from polyimide, polyacrylate and polysiloxane. In another embodiment, the planarization layer 240 may include or be made of an inorganic material, or may include or be made of a complex of an inorganic material and an organic material. A first contact hole CNT1 for exposing at least a part of the drain electrode DE may be defined or formed in the planarization layer 240.

The pixel electrode 250 may be disposed on the planarization layer 240. The pixel electrode 250 may be electrically connected to the drain electrode DE exposed by the first contact hole CNT1. That is, the pixel electrode 250 may be an anode which is a hole injection electrode within the organic light emitting diode OLED. When the pixel electrode 250 is an anode, the pixel electrode 250 may include a material having a relatively high work function to facilitate hole injection. The pixel electrode 250 may be a reflective electrode, a semi-transmissive electrode or a transmissive electrode. In an embodiment, the pixel electrode 250 may include a reflective material. In an embodiment, the reflective material may include at least one material selected from silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In) and magnesium-silver (Mg—Ag).

In an embodiment, the pixel electrode 250 may include or be formed of a single-layer film, but the invention is not limited thereto. That is, the pixel electrode 250 may include or be formed of a multi-layer film in which two or more materials are stacked or laminated.

When the pixel electrode 250 may include or be formed of a multi-layer film, in an embodiment, the pixel electrode 250 may include a reflective film and a transparent or translucent electrode which is disposed on the reflective film. In an embodiment, the pixel electrode 250 may include a reflective film and a transparent or translucent electrode which is disposed beneath the reflective film. In an embodiment, for example, the pixel electrode 250 may have a three-layer structure of indium tin oxide/Ag/indium tin oxide (ITO/Ag/ITO), but the invention is not limited thereto.

Here, the transparent or translucent electrode may contain at least one material selected from indium tin oxide ("ITO"), indium zinc oxide ("IZO"), zinc oxide (ZnO), indium oxide (In$_2$O$_3$), indium gallium oxide ("IGO"), and aluminum zinc oxide ("AZO").

A pixel defining film 260 may be disposed on the pixel electrode 250. The pixel defining film 260 includes an opening for exposing at least a part of the pixel electrode 250. The pixel defining film 260 may include an organic material or an inorganic material. In an embodiment, the pixel defining film 260 may include a material such as a photoresist, a polyimide resin, an acrylic resin, a silicone compound or a polyacrylic resin.

The organic light emitting layer 270 may be disposed on the pixel electrode 250 and the pixel defining film 260. More specifically, the organic light emitting layer 270 may be disposed on a region of the pixel electrode 250, the region being exposed through the opening of the pixel defining film 260. In an embodiment, the organic light emitting layer 270 may cover at least a part of the sidewall of the pixel defining film 260 which defines the opening therein.

In an embodiment, the organic light emitting layer 270 may emit one of red light, blue light and green light. In another embodiment, the organic light emitting layer 270 may emit white light, or may emit one of cyan light, magenta light and yellow light. When the organic light emitting layer 270 emits white light, the organic light emitting layer 270 may include a white light emitting material, or may have a laminated structure of a red light emitting layer, a green light emitting layer and a blue light emitting layer to emit white light.

A common electrode 280 may be disposed on the organic light emitting layer 270 and the pixel defining film 260. In an embodiment, the common electrode 280 may be disposed or formed entirely on the organic light emitting layer 270 and the pixel defining film 260. That is, the common electrode 280 may be disposed common to each of the organic light emitting layer 270 and the pixel defining film 260. In an embodiment, the common electrode 280 may be a cathode electrode of the organic light emitting diode OLED. In an embodiment, the common electrode 280 may include at least one material selected from Li, Ca, Li/Ca, LiF/Al, Al, Ag, and Mg. The common electrode 280 may include or be made of a material having a relatively low work function.

In an embodiment, the common electrode 280 may be a transparent or translucent electrode including at least one material selected from indium tin oxide ("ITO"), indium zinc oxide ("IZO"), zinc oxide (ZnO), indium oxide (In$_2$O$_3$), indium gallium oxide ("IGO"), and aluminum zinc oxide ("AZO").

The pixel electrode 250, the organic light emitting layer 270 and the common electrode 280 may together constitute an organic light emitting diode OLED. However, the invention is not limited thereto, and the organic light emitting diode OLED may have a multi-layer structure including a hole injection layer ("HIL"), a hole transporting layer ("HTL"), an electron transporting layer ("ETL"), and an electron injection layer ("EIL").

An encapsulation layer 300 may be disposed on the common electrode 280. The encapsulation layer 300 may reduce or effectively prevent water and air from outside the display panel PA from penetrating the organic light emitting diode OLED. In an embodiment, the encapsulation layer 300 may include a first inorganic layer 301, an organic layer 302, and a second inorganic layer 303.

The first inorganic layer 301 may be disposed on the common electrode 280. The first inorganic layer 301 may include at least one material selected from silicon oxide (SiOx), silicon nitride (SiNx) and silicon oxynitride (SiONx).

The organic layer 302 may be disposed on the first inorganic layer 301. The organic layer 302 may include any one material selected from epoxy, acrylate and urethane acrylate. The organic layer 302 may planarize the step difference caused by the pixel defining film 260.

The second inorganic layer 303 may be disposed on the organic layer 302. The second inorganic layer 303 may include at least one material selected from silicon oxide (SiOx), silicon nitride (SiNx) and silicon oxynitride (SiONx).

Although it is shown in FIG. 5 that each of the first inorganic layer 301, the organic layer 302 and the second inorganic layer 303 are each a single layer, the invention is not limited thereto. That is, at least one of the first inorganic layer 301, the organic layer 302 and the second inorganic layer 303 may be formed to have a multi-layer structure.

In another embodiment, the encapsulation layer 300 may include a hexamethyldisiloxane ("HMDSO") layer. More specifically, the encapsulation layer 300 may include the first inorganic layer 301, the second inorganic layer 303 and the HMDSO layer disposed between the first inorganic layer 301 and the second inorganic layer 303. That is, the above-described organic layer 302 may be replaced by the HMDSO layer.

In an embodiment of a method of manufacturing a display device, the HMDSO layer may be formed using the same process chamber after the first inorganic layer 301 is formed. Thus, a process of forming the encapsulation layer 300 may be simplified. The encapsulation layer 300 may include the HMDSO layer capable of absorbing stress to have sufficient flexibility.

In an embodiment, the encapsulation layer 300 may be formed as independent members respectively corresponding to each of the plurality of display units 600 or may be integrally formed with each of the plurality of display units 600, such that a single encapsulation layer 300 to commonly covers all of the plurality of display units 600.

In an embodiment, on the encapsulation layer 300 may be further provided functional layers such as a protective layer (not shown) for protecting the organic light emitting diode OLED and/or a touch sensing layer (not shown).

In an embodiment, the display unit 600 indicated in FIG. 4 may include the organic light emitting diode OLED and the switching element TR2 along with the various layers 101 through 300 shown in FIG. 5. Such collection of elements and layers may be disposed on a base substrate of the display panel PA, without being limited thereto. The display unit 600 may include a light emitting region, such as at the opening in the pixel defining film 260, without being limited thereto. In an embodiment, the base substrate of the display panel PA may be disposed below the layers shown in FIG. 5, without being limited thereto.

Referring again to FIG. 3, the normal display area NA may be disposed inside the stretchable display area STA in the top plan view. That is, the stretchable display area STA may be disposed to surround the outer periphery of the normal display area NA. The stretchable display area STA may be disposed closer to an outer edge of the overall display panel PA than the normal display area NA. The stretchable display area STA may be disposed at each side of the display panel PA as illustrated in FIG. 3, without being limited thereto. In an embodiment, the stretchable display area STA may be disposed at less than all sides of the display panel PA.

The normal display area NA may include a normal substrate. A normal substrate may be defined as a portion of the display panel PA which less deformable or less restorable to an original form after a forced applied thereto. The normal substrate portion of the display panel PA may have less flexibility than the stretchable substrate portion. Unlike the stretchable substrate STS, the normal substrate may have a uniform plate shape over the entire surface thereof.

A plurality of pixels is arranged on the normal substrate, and each of the pixels may include at least one organic light emitting diode. The pixels on the normal substrate in the normal display area NA may be driven to generate and/or emit light to display an image.

The normal substrate may have a substantially same basic structure the stretchable substrate STS, except that a pattern including the island 101, the bridge 103 and the empty space V is further included or formed at the stretchable substrate STS. That is, FIG. 5 may be a view showing a cross-section of one pixel formed on a normal substrate if only the island 101 is replaced by the normal substrate. In an embodiment, the normal substrate at the normal display area NA includes the common base substrate of the display panel PA, excluding the island 101, the bridge 103 and the empty space V, while the stretchable substrate STS includes the common base substrate of the display panel PA having the island 101, the bridge 103 and the empty space V.

As described above, when the display area DA includes the stretchable display area STA having relatively high flexibility, the transfer capability of sound caused by the vacuum provided from the vibration member 50 can be improved. That is, the flexibility of the stretchable display area STA can reduce the vibration width of the normal display area NA (e.g., along the thickness direction of the display device). Since the degree of freedom of movement of the normal display area NA increases, the transfer of sound through vibration can be made easier. That is, the sound provided from the vibration member 50 can be transferred within the display device and to a user without loss.

Although it is shown in FIG. 3 that the display area DA includes the stretchable display area STA and the normal display area NA, the range of the stretchable display area STA is not limited thereto.

In another embodiment, the non-display area NDA may also have stretchable characteristics. The non-display area NDA may also include the above-described stretchable substrate STS. In this case, the flexibility of the non-display area NDA may be substantially the same as the flexibility of the stretchable display area STA.

The cover window CW may be disposed on the display panel PA.

The cover window CW may include or be made of transparent glass or plastic. That is, the cover window CW may include a light-transmissive material.

The cover window CW may include a central portion CP and a peripheral portion PP. Details thereof will be described with reference to FIG. 6.

Figure 6:
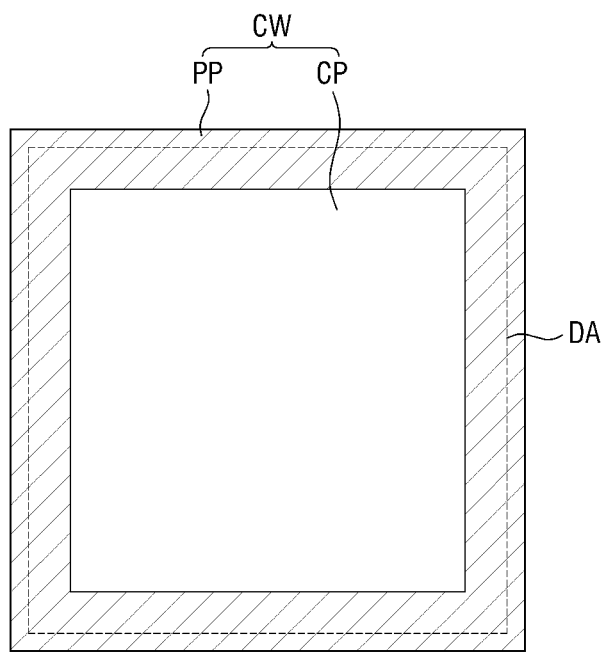
FIG. 6 is a partial top plan view of an embodiment of a cover window of a display device according to the invention.

FIG. 6 is a partial top plan view of a display device according to the invention. FIG. 6 shows the cover window CW relative to a portion of the display panel PA. The bracket BC of the display device in FIGS. 1 and 2 are omitted for convenience of explanation.

The cover window CW may include the central portion CP and the peripheral portion PP which is disposed to surround the outer periphery of the central portion CP.

In an embodiment, the peripheral portion PP may have relatively higher flexibility than the central portion CP.

In order for the peripheral portion PP to have higher flexibility than the central portion CP, in an embodiment, the central portion CP may include or be made of a relatively rigid material having relatively low flexibility, and the peripheral portion PP may include or be made of a relatively soft material having relatively high flexibility.

In an embodiment, for example, the central portion CP may include or be made of glass, and the peripheral portion PP may include or be made of plastic, silicone, or a polymer material having elasticity.

An example of the polymer material having elasticity may include polydimethylsiloxane ("PDMS"). However, this is illustrative, and the polymer material having elasticity is not limited thereto.

When the peripheral portion PP has relatively high flexibility, the movement of the relatively rigid/low flexibility central portion CP due to the vibration transferred through the vibration member 50 is relatively reduced. That is, the flexibility of the peripheral portion PP at an outside edge of the display device can help a user not feel the transferred vibration.

In one or more embodiment of the display device, the quality of sound transferred through vibration can be improved. The reason for this is that the degree of freedom of movement of the central portion CP is improved due to the flexibility of the peripheral portion PP. That is, the improvement of degree of freedom of movement of the central portion CP exhibits a similar effect to an increase in size of a sound box, and thus sound provided from the vibration member 50 may be clearly transferred to a user.

Referring to FIG. 2 again, the peripheral portion PP having higher flexibility than the central portion CP may overlap the stretchable display area STA of the display panel PA. In this case, an inner side surface or edge of the stretchable display area STA and an inner side surface or edge of the peripheral portion PP may be aligned with each other.

Like this, when the peripheral portion PP and the stretchable display area STA of the display panel PA, each having relatively high flexibility, overlap each other, the vibration width (e.g., in the thickness direction of the display device) of the normal display area NA and the central portion CP, each having relatively low flexibility, may be made small. Therefore, the degree of vibration recognized by the user may decrease or become zero. In addition, the degree of freedom of movement of the central portion CP and the normal display area NA increases, so as to improve the transfer capability of sound through vibration.

That is, the improvement in degree of freedom of movement of the normal display area NA and the central portion CP can provide better call quality to the user.

Figure 7:
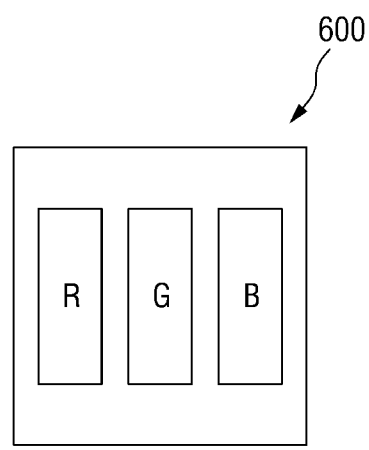
FIG. 7 is a partial top plan view of an embodiment of a display unit of a display device according the invention.
Figure 8:
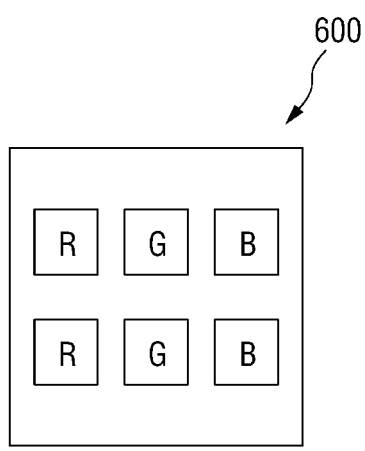
FIG. 8 is a partial top plan view of a modified embodiment of a display unit of a display device according to the invention.

FIG. 7 is a partial top plan view of a display unit of a display device according to the invention. FIG. 8 is a partial top plan view of a modified embodiment of a display unit of a display device according to the invention.

In an embodiment, a plurality of organic light emitting diodes OLEDs may be disposed on a single one of the display unit 600. That is, as shown in FIG. 7, the display unit 600 may include an organic light emitting diode OLED for emitting red light (R), an organic light emitting diode OLED for emitting blue light (B) and an organic light emitting diode OLED for emitting green light (G). Although it is shown in FIG. 7 that the organic light emitting diodes OLEDs are arranged in order of R, G and B, the arrangement of the organic light emitting diodes OLEDs is not limited thereto. That is, the plurality of organic light emitting elements OLEDs may be arranged as shown in FIG. 8, or may be arranged in a pentagonal shape or structure or a honeycomb shape or structure.

Hereinafter, a display device according to other embodiments of the invention will be described. Some of the components to be described below may be substantially the same as the components having been described in one or more of the previously-described embodiments of the display device according to the invention. Descriptions of some components may be omitted to avoid duplicate descriptions. FIGS. 9 through 12 may be views taken along line I-I' of FIG. 1.

Figure 9:
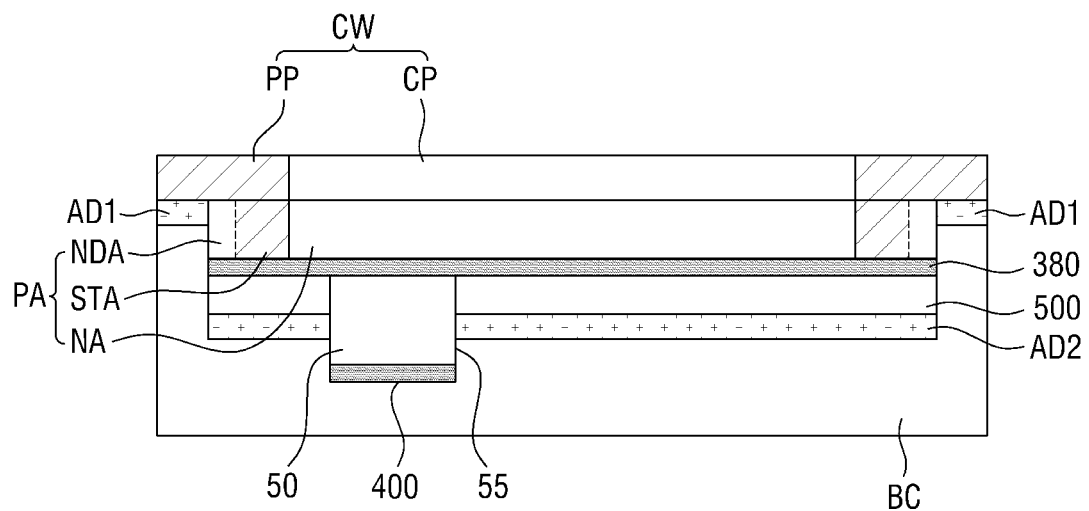
FIG. 9 is a cross-sectional view of another embodiment of a display device according to the invention.

FIG. 9 is a cross-sectional view of another embodiment of a display device according to the invention.

Referring to FIG. 9, in an embodiment, a second adhesive layer AD2 may be interposed between the cover panel 500 and bracket BC.

The second adhesive layer AD2 may be disposed or formed on the entire back surface of the cover panel 500 excluding an area where the vibration member 50 is inserted.

Accordingly, the second adhesive layer AD2 may attach the cover panel 500 to the bracket BD.

In an embodiment, the second adhesive layer AD2 may include a photocurable resin or a thermosetting resin having relatively high transmittance and adhesive performance. In an embodiment, for example, the second adhesive layer AD2 may be obtained by applying a resin such as an acrylic resin to the cover panel 500 and/or the bracket BD, and then curing the applied resin by irradiating light such as ultraviolet (UV) light.

In an embodiment, the second adhesive layer AD2 may include a pressure-sensitive adhesive ("PSA") such as in a tape form.

In an embodiment, the second adhesive layer AD2 may include an optically clear adhesive ("OCA") such as in a tape form.

In an embodiment, a thickness of the second adhesive layer AD2 may be about 10 micrometers (μm) to about 20 μm.

Figure 10:
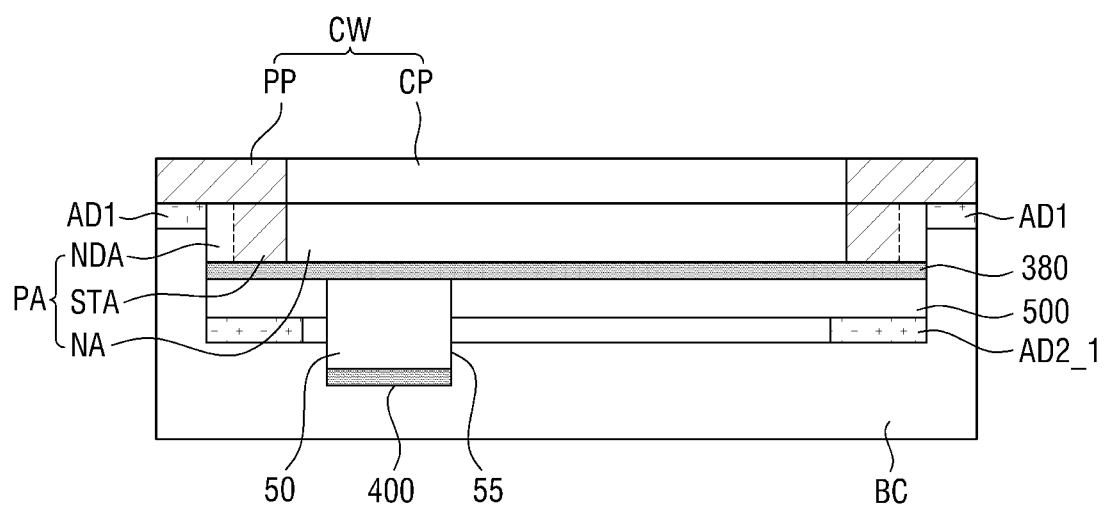
FIG. 10 is a cross-sectional view of a modified embodiment of display device according to the invention.

FIG. 10 is a cross-sectional view of a modified embodiment of a display device according to the invention.

Referring to FIG. 10, a second adhesive layer AD2_1 may be disposed on a partial portion of the back surface of the cover panel 500. That is, unlike that shown in FIG. 9, the second adhesive layer AD2_1 may be formed at partial portions of the back surface of the cover panel 500 excluding an area where the vibration member 50 is inserted. The second adhesive layer AD2_1 may be provided in plurality spaced apart from each other.

Figure 11:
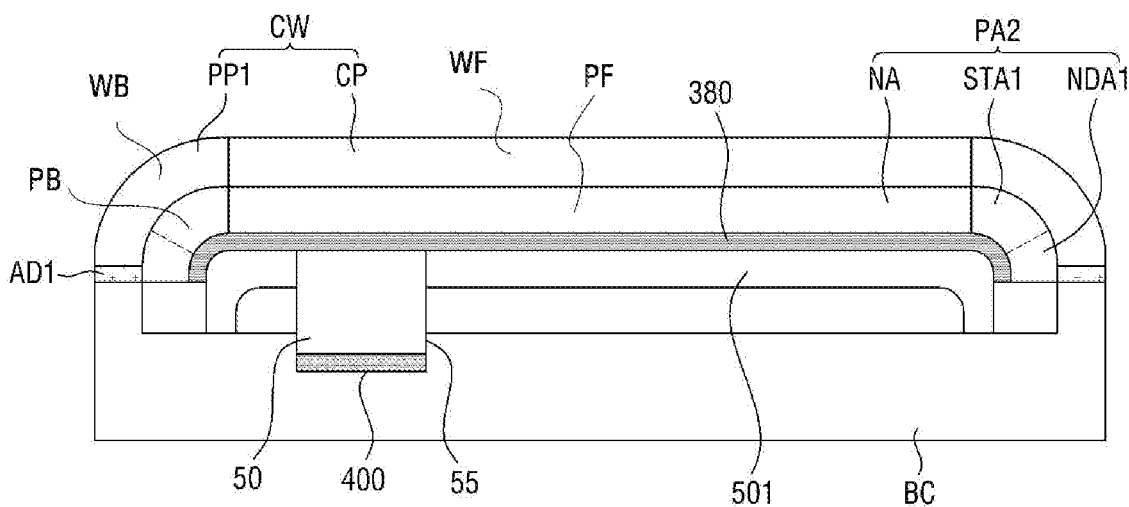
FIG. 11 is a cross-sectional view of still another embodiment of a display device according to the invention.

FIG. 11 is a cross-sectional view of still another embodiment of a display device according to the invention.

Referring to FIG. 11, in a display device according to this embodiment, each of a cover window CW and a display panel PA2 may include a flat portion having a flat upper surface, and a bent portion which is disposed at both of opposing sides of the flat portion and having a curved shape with a curvature.

In an embodiment, the flat portion WF of the cover window CW may overlap the flat portion PF of the display panel PA2, and the bent portion WB of the cover window CW may overlap the bent portion PB of the display panel PA2.

In an embodiment, the flat portion WF of the cover window CW may be a central portion CP, and the bent portion WB of the cover window CW may be a peripheral portion PP1. That is, the bent portion WB of the cover window CW may have a shape curved along at least one curvature. As described above, since the flexibility of the peripheral portion PP1 is higher than the flexibility of the central portion CP, the flexibility of the bending portion WB of the cover window CW may be higher than the flexibility of the flat portion WF thereof.

In an embodiment, the flat portion PF of the display panel PA2 may include a normal display area NA, and the bent portion PB of the display panel PA2 may include a stretchable display area STA1 and a non-display area NDA1.

That is, the stretchable display area STA1 and the non-display area NDA1 disposed at both of opposing sides of the normal display area NA may have a shape curved along at least one curvature.

When the cover window CW and the display panel PA2 have bent portions as described above, a cover panel 501 may have bent portions at both of opposing sides of a flat portion thereof.

Figure 12:
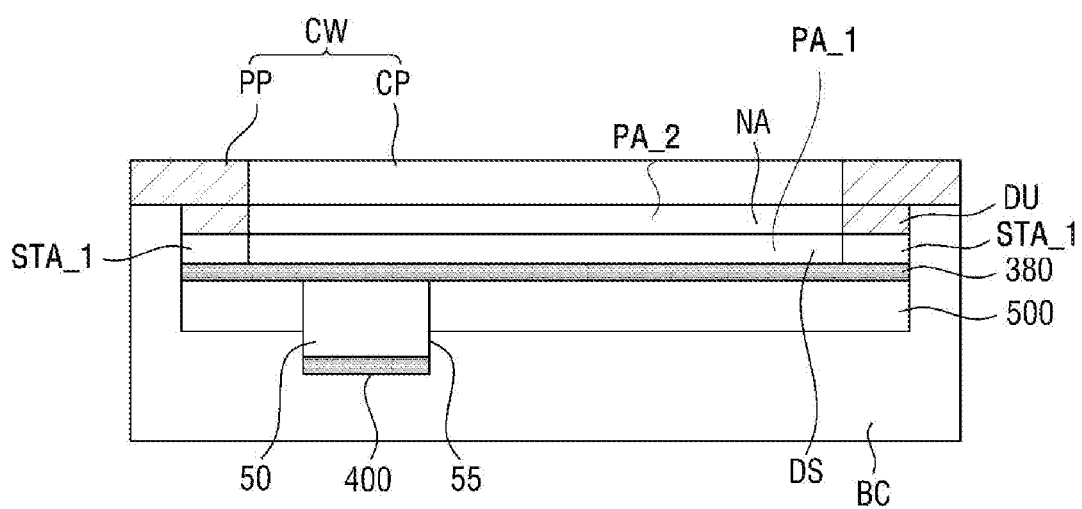
FIG. 12 is a cross-sectional view of yet another embodiment of a display device according to the invention.

FIG. 12 is a cross-sectional view of yet another embodiment of a display device according to the invention.

Referring to FIG. 12, a display device according to this embodiment may include a first display panel PA_1 including a stretchable display area STA_1 and a first dummy area DS, a second display panel PA_2 including a normal display area NA and a second dummy area DU, and a cover windows CW including a peripheral portion PP and a central portion CP. The second display panel PA_2 is disposed closed to a viewing side of the display device than the first display panel PA_1.

In an embodiment, the first display panel PA_1 may include the stretchable display area STA_1 and the first dummy area DS. The stretchable display area STA_1 of the second display panel PA_2 may be substantially the same as the stretchable display area described above in one or more embodiment of the display device according to the invention.

The stretchable display area STA_1 may be disposed to surround the outer periphery of the first dummy area DS in a top plan view. In an embodiment, the stretchable display area STA_1 of the first display panel PA_1 may have relatively higher flexibility than the normal display area NA of the second display panel PA_1. For this purpose, as described above, the stretchable display area STA_1 may include a stretchable substrate STS.

The first dummy area DS of the first display panel PA_1 may overlap the normal display area NA of the second display panel PA_2. In an embodiment, the first dummy area DS may have substantially the same planar area as the normal display area NA in the top plan view.

Since an image is displayed at the normal display area NA of the second display panel PA_2, the first dummy area DS of the first display panel PA_1 overlapping the normal display area NA in the top plan view, may not display an image. That is, the first dummy area DS may have no function except for compensating a step difference within the display device.

In an embodiment, the first dummy area DS of the first display panel PA_1 may include a stretchable substrate STS in the same manner as the stretchable display area STA_1.

The second display panel PA_2 may be disposed on the first display panel PA_1, to be closer to the cover window CW than the first display panel PA_1.

The second display panel PA_2 may include the normal display area NA and the second dummy area DU. The normal display area NA of the second display panel PA_2 may be substantially the same as that described above in one or more embodiment of the display device according to the invention. The second dummy area DU of the second display panel PA_2 may be disposed outside the normal display area NA in a top plan view. The second dummy area DU of the second display panel PA_2 may overlap the stretchable display area STA_1 of the underlying first display panel PA_1, and may have substantially the same planar size as the stretchable display area STA_1 in the top plan view.

In an embodiment, the second dummy area DU of the second display panel PA_2 may have optical transparency. Accordingly, the image generated in the stretchable display area STA_1 may be provided to a user through the optically transparent second dummy area DU.

In an embodiment, the second dummy area DU may include or be made of an elastic material for step difference compensation. In this case, the second dummy area DU may include or be made of a polymer material having elasticity. In an embodiment, the second dummy area DU may have relatively higher flexibility than that of the normal display area NA.

The second dummy area DU may overlap the peripheral portion PP of the cover window CW. That is, the peripheral portion PP of the cover window CW, the second dummy area DU of the second display panel PA_2, and the stretchable display area STA_1 of the first display panel PA_1 may overlap one another in the top plan view. Thus, as described above, when considering the entire display device in FIG. 12, the flexibility of the edge portion thereof (e.g., at the peripheral portion PP, the second dummy area DU and the stretchable display area STA_1) may be made higher than the flexibility of the middle portion thereof (e.g., at central portion CP, the normal display area NA and the first dummy area DS). When the flexibility of the edge portion of a display device is higher than the flexibility of the middle portion thereof, as described above, the sound provided from the vibration member 50 may be transferred to a user without loss while reducing a degree of the vibration recognized by the user.

Although FIG. 12 does not show a non-display area (NDA in FIG. 3), in an embodiment, a non-display area of the second display panel PA_2 may be included within the second dummy area DU.

In another embodiment, the non-display area of the second display panel PA_2 may be disposed between the second dummy area DU and the normal display area NA.

Although FIG. 12 illustrates a case where the second display panel PA_2 is disposed on the first display panel PA_1 to be closer to the cover window CW, the stacking order of both of them is not limited thereto. In another embodiment, the first display panel PA_1 may be disposed on the second display panel PA_2 to be closer to the cover window CW.

As described above, according to one or more embodiment of the invention, call quality is improved.

Further, sound transfer capability through vibration is improved to improve the call quality using the sound transfer.

The effects of the invention are not limited by the foregoing, and other various effects are anticipated herein.

Although embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device, comprising:
   a display panel including a display area at which an image is displayed, the display area comprising:
   a first display area at which the display panel is stretchable, disposed at an outer edge of the display device, the first display area including a display unit with which the image is generated, and
   a second display area having flexibility less than that of the first display area, the second display area disposed more inward from the outer edge of the display device than the first display area;
   a cover window disposed on the display panel, including a peripheral portion and a central portion which is more inward from the outer edge of the display device than the peripheral portion; and
   a vibration unit which transfers sound through vibration, the vibration unit overlapping the second display area along a thickness direction of the display device.

2. The display device of claim 1, wherein the peripheral portion of the cover window overlaps the first display area of the display panel, along the thickness direction of the display device.

3. The display device of claim 1, wherein the first display area of the display panel includes:
   an island provided in plurality spaced apart from each other, and
   a bridge provided in plurality respectively connecting the plurality of islands to each other, the bridge being stretchable.

4. The display device of claim 3, wherein within the first display area of the display panel:
   the display unit includes an organic light emitting diode, and
   the display unit which includes the organic light emitting diode is disposed on the island of the first display area.

5. The display device of claim 4, the first display area of the display panel further includes a first wiring and a second wiring disposed in different layers of the display panel and each electrically connected to the display unit.

6. The display device of claim 5, wherein
   the bridge which is stretchable has a serpentine shape extended between islands connected to each other by the bridge, and
   each of the first wiring and the second wiring:
   is connected to both display units respectively disposed on the islands connected to each other by the bridge which is stretchable, and
   has a serpentine shape corresponding to that of the bridge to be stretchable together with the bridge.

7. The display device of claim 1, further comprising a bracket in which the vibration unit and the display panel are accommodated,
   wherein the bracket is attached to the peripheral portion of the cover window and disposes the display panel and the vibration unit between the bracket and the cover window.

8. The display device of claim 7, further comprising a cover panel which radiates heat from or absorbs an impact to the display panel, disposed between the display panel and the bracket.

9. The display device of claim 8, further comprising an adhesive layer disposed between the bracket and the cover panel, which attaches the bracket and the cover panel to each other.

10. The display device of claim 1, wherein the vibration unit includes a piezo material.

11. The display device of claim 1, wherein the peripheral portion of the cover window disposed on the display panel, extends further than the second display area of the display panel, the extended peripheral portion being bent with at least one curvature in the thickness direction of the display device.

12. The display device of claim 11, wherein the first display area of the display panel on which the cover window is disposed, extends further than the central portion of the cover window to be bent corresponding to the curvature of the peripheral portion of the cover window.

13. The display device of claim 1, wherein the central portion of the cover window disposed on the display panel has flexibility less than that of the peripheral portion of the cover window.

14. The display device of claim 13, wherein within the cover window:
- a material of the central portion having flexibility less than that of the peripheral portion includes glass, and
- a material of the peripheral portion includes at least one selected from plastic, silicone and a polymer material having elasticity.

* * * * *